United States Patent
Komori

(10) Patent No.: US 6,667,526 B2
(45) Date of Patent: Dec. 23, 2003

(54) TUNNELING MAGNETORESISTIVE STORAGE UNIT

(75) Inventor: Shigeki Komori, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/227,289

(22) Filed: Aug. 26, 2002

(65) Prior Publication Data

US 2003/0107057 A1 Jun. 12, 2003

(30) Foreign Application Priority Data

Dec. 7, 2001 (JP) ........................................ 2001-373638

(51) Int. Cl.$^7$ .............................................. H01L 29/82
(52) U.S. Cl. ...................... 257/421; 257/295; 257/421; 365/157; 365/173; 365/225.5; 365/230.06; 338/32 R
(58) Field of Search ................................. 257/295, 421; 365/157, 173, 225.5, 230.06; 338/32 R

(56) References Cited

U.S. PATENT DOCUMENTS 6,515,573 B1 * 2/2003 Dong et al. ................ 338/32 R

FOREIGN PATENT DOCUMENTS

JP     11-251139     9/1999

* cited by examiner

Primary Examiner—David Nelms
Assistant Examiner—Mai-Huong Tran
(74) Attorney, Agent, or Firm—Burns, Doane, Swecker & Mathis, LLP

(57) ABSTRACT

A tunneling magnetoresistive storage unit (TMR unit) includes a hollow cylinder-shaped free-spin element having one open end, a columnlike fixed-spin element formed inside the cylinder-shaped free-spin element, and a thin insulator layer located between them. The spin direction in the fixed-spin element is fixed to a predefined circumferential direction of its column-shaped magnetic substance beforehand and a tunneling current is flowed between the free-spin element and the fixed-spin element. A rotating magnetic field produced as a consequence is used to set the spin direction in the cylinder-shaped free-spin element to one of its circumferential directions. This structure decreases the amount of electric current required for performing data write operation, also enabling miniaturization and a higher level of integration of the TMR unit and a magnetic random-access memory by employing such TMR units.

5 Claims, 9 Drawing Sheets

TUNNELING MAGNETORESISTIVE STORAGE UNIT

BACKGROUND OF THE INVENTION

1. Field of the Invention

The present invention relates to a tunneling magnetoresistive storage unit (hereinafter referred to as the TMR unit) having a magnetic substance structure.

2. Description of the Background Art

An MRAM is a memory device which utilizes a phenomenon that the resistance to an electric current flowing through a magnetic substance structure varies depending on the direction of electron spin (magnetization direction) in the magnetic substance. TMR units are storage units conventionally used for storing information. Each cell of a magnetic memory, capable of storing one bit of information, includes one each TMR unit and metal-oxide-semiconductor (MOS) transistor.

FIG. 10 is a cross-sectional diagram showing the construction of a conventional MRAM device. In this Figure, designated by the numeral 100 is a TMR unit having a sandwich structure with a thin insulator layer 102 sandwiched between a first magnetic substance layer 101 and a second magnetic substance layer 103. Designated by the numeral 150 is a semiconductor substrate (hereinafter referred to simply as the substrate) on which an access transistor, which is a MOS transistor, is formed, and designated by the numeral 155 are source/drain regions of the access transistor. Designated by the numeral 160 is a readout word line which serves as a gate electrode of the access transistor and designated by the numeral 165 is its write word line. Designated by the numeral 170 is an electrode section for connecting one of the source/drain regions 155 to the first magnetic substance layer 101, designated by the numeral 175 is an interlayer insulator stacked between the individual layers, and designated by the numeral 180 is a bit line. In this structure, the first magnetic substance layer 101 forms a free-spin layer in which the direction of electron spin is not fixed but variable while the second magnetic substance layer 103 forms a fixed-spin layer in which the direction of electron spin is fixed to a specific direction. Since the sandwich structure of the TMR unit 100 has a rectangular shape in top view that is elongate in the direction of the bit line 180, the spin direction in the first magnetic substance layer 101 could easily become parallel to the direction of the bit line 180 (bit line direction). The spin direction in the second magnetic substance layer 103 is fixed to this bit line direction.

Storage (writing) of data into the TMR unit 100 of the aforementioned conventional MRAM device is performed by producing flows of electric currents through the bit line 180 and the write word line 165 and determining the spin direction in the first magnetic substance layer 101 which forms a free-spin layer with the aid of magnetic fields generated by the electric currents, as shown in FIG. 11. Specifically, a binary "1" or "0" is written in the TMR unit 100 depending on whether the spin direction in the first magnetic substance layer 101 is the same (parallel) as or opposite (antiparallel) to that in the second magnetic substance layer 103. This data write operation requires at least a specific magnetic field strength to perform. In addition, the data write operation is characterized in that it is carried out in one memory cell where the corresponding bit line 180 and the corresponding write word line 165 intersect each other.

On the other hand, the data stored in the TMR unit 100 is read by applying a voltage across the first magnetic substance layer 101 and the second magnetic substance layer 103 and a voltage to the readout word line 160 to turn on the access transistor and then measuring an electric current flowing into the access transistor. The amount of this electric current is large when the spin direction in the first magnetic substance layer 101 is the same as that in the second magnetic substance layer 103, whereas the amount of the electric current is small when the spin direction in the first magnetic substance layer 101 is opposite to that in the second magnetic substance layer 103. This property is used in the execution of data read operation. Specifically, the data in the TMR unit 100 is read by varying the electrical resistance between the first magnetic substance layer 101 and the second magnetic substance layer 103, turning on the access transistor, and judging the amount of the electric current flowing from the bit line 180 into the access transistor.

In the structure of the conventional MRAM device described above, it is essential that write word lines and readout word lines be separately arranged and it is difficult to reduce the width of the word lines and bit lines due to the need to form a TMR unit in each of their intersecting areas. It is also difficult to reduce the area occupied by each TMR unit as it is formed by stacking platelike magnetic substance layers with an insulator layer sandwiched in between. In addition, when the TMR unit is miniaturized, it requires a greater magnetic field strength, and accordingly a larger writing current, for reversing the spin direction. Due to these properties, the aforementioned structure of the conventional MRAM device is unsuited for achieving miniaturization and a higher level of integration.

SUMMARY OF THE INVENTION

This invention is intended to provide a solution to the aforementioned problems of the prior art. Specifically, it is an object of the invention to provide a structure of an TMR unit suited for achieving miniaturization and a higher level of integration. It is another object of the invention to provide a miniaturized MRAM device featuring a higher level of integration by employing such TMR units.

In a first principal form of the invention, a tunneling magnetoresistive storage unit includes a hollow cylinder-shaped first magnetic substance element whose magnetization direction is variable, the first magnetic substance element having one open end, a columnlike second magnetic substance element whose magnetization direction is fixed to one circumferential direction, the second magnetic substance element being formed inside the cylinder-shaped first magnetic substance element, and an insulator layer located between the first and second magnetic substance elements. A tunneling current is flowed between the first and second magnetic substance elements to produce a rotating magnetic field for setting the magnetization direction of the first magnetic substance element to one of its circumferential directions, wherein magnetoresistance due to a change in the magnetization direction of the first magnetic substance element with respect to the magnetization direction of the second magnetic substance element is used to represent binary data.

This construction makes it possible to reduce the amount of electric current required for performing data write operation, decrease the area occupied by the tunneling magnetoresistive storage unit, and achieve miniaturization and a higher level of integration.

In a second principal form of the invention, a tunneling magnetoresistive storage unit includes a first magnetic substance element whose magnetization direction is variable, a second magnetic substance element whose magnetization direction is fixed to one circumferential direction and an insulator layer located between the first and second magnetic substance elements. The first magnetic substance element is formed into a one-piece structure including a columnlike portion and a cylindrical portion which surrounds the columnlike portion and has one open end. The second magnetic substance element is formed into a hollow cylindrical shape having one open end and is located between the columnlike portion and the cylindrical portion of the first magnetic substance element. In the tunneling magnetoresistive storage unit thus constructed, a tunneling current is flowed between the first and second magnetic substance elements to produce a rotating magnetic field for setting the magnetization direction of the first magnetic substance element to one of its circumferential directions, wherein magnetoresistance due to a change in the magnetization direction of the first magnetic substance element with respect to the magnetization direction of the second magnetic substance element is used to represent binary data.

This construction makes it possible to reduce the amount of electric current required for performing the data write operation and improve the reliability of data readout. The construction also serves to decrease the area occupied by the tunneling magnetoresistive storage unit, and achieve miniaturization and a higher level of integration.

In a third principal form of the invention, a tunneling magnetoresistive storage unit includes a hollow cylinder-shaped magnetic substance element whose magnetization direction is variable, the magnetic substance element opening at both ends, a columnlike conductor element passing through the cylinder-shaped magnetic substance element, and an insulator layer located between the magnetic substance element and the conductor element. An electric current is flowed through the conductor element to produce a rotating magnetic field for setting the magnetization direction of the magnetic substance element to one of its circumferential directions, and the magnetization direction of the magnetic substance element is detected from the amount of electric current which flows through the conductor element.

This construction also makes it possible to reduce the amount of electric current required for performing the data write operation, decrease the area occupied by the tunneling magnetoresistive storage unit, and achieve miniaturization and a higher level of integration.

These and other objects, features and advantages of the invention will become more apparent upon reading the following detailed description in conjunction with the accompanying drawings.

DESCRIPTION OF THE PREFERRED EMBODIMENTS

First Embodiment

Figure 1A:
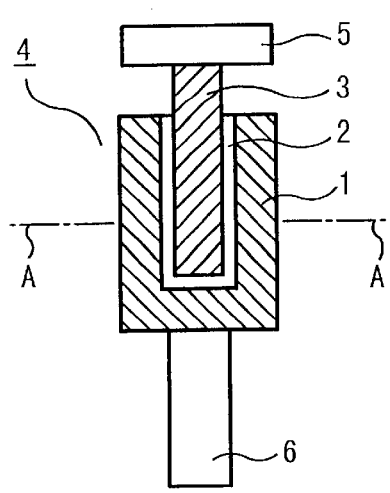
FIGS. 1A–1C are cross-sectional diagrams showing the constructions of a TMR unit and an MRAM device according to a first embodiment of the invention.
Figure 1B:
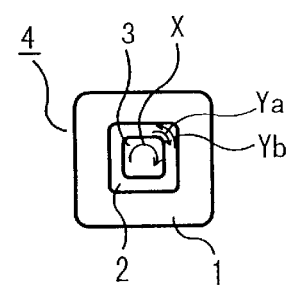
Figure 1C:
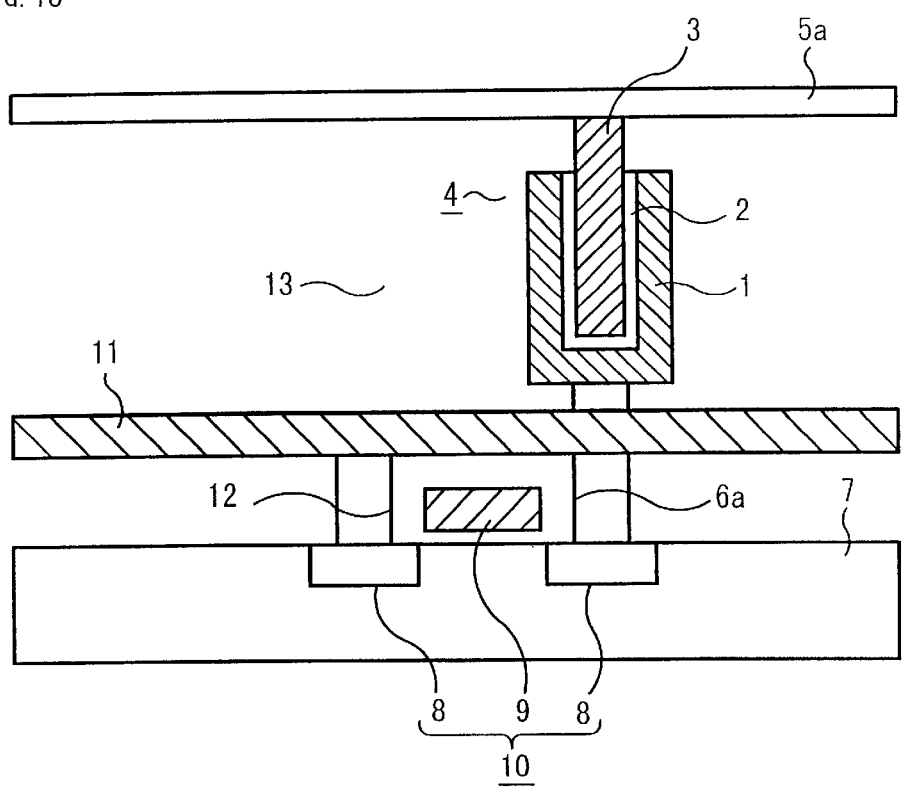

A TMR unit 4 and an MRAM device according to a first embodiment of the invention are now described. FIGS. 1A–1C show the constructions of the TMR unit 4 and the MRAM device incorporating the TMR unit 4 according to the first embodiment of the invention, in which FIG. 1A is a cross-sectional diagram showing the construction of the TMR unit 4, FIG. 1B is a cross-sectional diagram taken along lines A—A of FIG. 1A, and FIG. 1C is a cross-sectional diagram showing the construction of the MRAM device. The cross-sectional shape of the TMR unit 4 shown in FIG. 1B need not necessarily be a square but may be a rectangle, circle or ellipse, for instance.

Referring to FIG. 1A, the TMR unit 4 includes a free-spin element (first magnetic substance element) 1 formed into a cylindrical shape having an open upper end, for instance, a columnlike fixed-spin element (second magnetic substance element) 3 formed inside the cylinder-shaped free-spin element 1, and a thin insulator layer 2 located between the free-spin element 1 and the fixed-spin element 3. The spin direction in the free-spin element 1 is variable rather than fixed. Designated by the numerals 5 and 6 in FIG. 1A are electrode sections connected to the fixed-spin element 3 and the free-spin element 1, respectively.

In the TMR unit 4 thus constructed, the spin direction in the fixed-spin element 3 is fixed to a predefined circumferential direction (shown by arrow X) of its column-shaped magnetic substance as illustrated in FIG. 1B by applying a strong magnetic field beforehand. When writing data in the TMR unit 4, a relatively large tunneling current (e.g., a few mA or above) is flowed from the free-spin element 1 to the fixed-spin element 3, or from the fixed-spin element 3 to the free-spin element 1, through the insulator layer 2. As a result, a rotating magnetic field is produced around the fixed-spin element 3 and the free-spin element 1 and the spin direction in the free-spin element 1 is set to one circumferential direction (arrow Ya or arrow Yb) of the cylindrical shape of the free-spin element 1, whereby the data is written in the TMR unit 4. This circumferential rotating direction is determined according to whether the current is flowed from the free-spin element 1 to the fixed-spin element 3 or from the fixed-spin element 3 to the free-spin element 1. More specifically, binary data "1" or "0" is written in the TMR unit 4 depending on whether the spin direction (arrow Ya or arrow Yb) in the free-spin element 1 is the same as or opposite to the spin direction (arrow X) in the fixed-spin element 3.

On the other hand, the data stored in the TMR unit 4 is read by determining the resistance as measured-across the free-spin element 1 and the fixed-spin element 3 with an electric current flowed between them, the electric current falling within such a low range that no data is rewritten in the TMR unit 4. A relatively large electric current flows when the spin direction (arrow Ya or arrow Yb) in the free-spin element 1 is the same as the spin direction (arrow X) in the fixed-spin element 3, whereas quite a small amount of electric current flows when the spin direction in the free-spin element 1 is opposite to that in the fixed-spin element 3. This property is used in detecting the spin direction in the free-spin element 1, which represents information written in the TMR unit 4.

The construction of the MRAM device is now described below. Referring to FIG. 1C, each memory cell on a semiconductor substrate 7 (hereinafter referred to simply as the substrate 7) which is made of a p-type material, for instance, comprises an access transistor 10 including source/drain regions 8 and a word line 9 and a TMR unit 4 including a free-spin element 1, an insulator layer 2 and a fixed-spin element 3. The word line 9 and a bit line 11 are made of fine linear patterns corresponding to cell size. The free-spin element 1 of each TMR unit 4 is connected to one of the source/drain regions 8 via a contact hole 6a while the bit line 11 is connected to the other of the source/drain regions 8 via a contact hole 12. Designated by the numeral 5a in FIG. 1C is a flat platelike common electrode to which the fixed-spin element 3 of the TMR unit 4 is connected. The common electrode 5a is disposed above individual TMR units 4 as if covering the entire chip (MRAM device), or a plurality of blocks of cell arrays. Designated by the numeral 13 is an interlayer insulator.

Operation of the MRAM device of this embodiment is now explained in the following. The common electrode 5a is normally set to a potential equal to half a source voltage and the bit line 11 is set to the ground potential or to a potential equal to the source voltage. When the access transistor 10 is turned on by applying a voltage to the word line 9, there is formed a path for electric current to pass from the common electrode 5a through the TMR unit 4, the access transistor 10 and the bit line 11 in this order, wherein the direction of the current is determined by the potential of the bit line 11. This electric current produces a rotating magnetic field around the TMR unit 4 and, as a consequence, the spin direction in the cylinder-shaped free-spin element 1 is aligned and set to one circumferential direction (arrow Ya or arrow Yb). One cycle of data write operation is completed at this point.

Next, data read operation performed by the MRAM device is explained. When reading data from the TMR unit 4, the bit line 11 is set to a potential slightly higher or slightly lower than half the source voltage and the common electrode 5a is set to a potential half the source voltage. When the access transistor 10 is turned on by applying a voltage to the word line 9 under these conditions, an electric current flows through the path from the common electrode 5a through the TMR unit 4, the access transistor 10 and the bit line 11. Then, a judgment is made on the amount of the electric current. The electric current flowed in the data read operation is so small that no data is rewritten in the TMR unit 4, thereby enabling detection of the spin direction in the free-spin element 1 of the TMR unit 4.

While the bit line 11 is set to a potential slightly higher or slightly lower than half the source voltage in the aforementioned data read operation, the data read operation may be performed by turning on the access transistor 10 with the bit line 11 set to the ground potential or the potential equal to the source voltage and the word line 9 set to a potential lower than normal, thereby controlling the electric current flowing through the TMR unit 4 by use of channel resistance such that the electric current falls within a low range that does not cause any data rewritten in the TMR unit 4.

In the present embodiment, the TMR unit 4 is formed of the cylinder-shaped free-spin element 1, the thin insulator layer 2 located inside the free-spin element 1 and the columnlike fixed-spin element 3 disposed inside the insulator layer 2, and a relatively large tunneling current is flowed between the free-spin element 1 and the fixed-spin element 3 to generate a rotating magnetic field and thereby determine the spin direction in the free-spin element 1. Since the conventional TMR unit is formed by stacking flat platelike magnetic substance layers with an insulator layer sandwiched in between, it has been impossible to effectively use the magnetic field generated during the data write operation. In contrast, it is possible to effectively use the magnetic field generated in the data write operation because the free-spin element 1 has a cylindrical shape in the aforementioned embodiment. In addition, since the spin direction set in the free-spin element 1 is its circumferential direction (arrow Ya or arrow Yb), the direction of electron spins can be easily aligned. Consequently, the electric current required for writing data is reduced and the data write operation can be performed with a small amount of writing current.

Furthermore, since the TMR unit 4 is arranged in a vertical position, it is possible to reduce the area it occupies and its structure is suited for achieving miniaturization and a higher level of integration. Moreover, the area occupied by each TMR unit 4 is small, the word lines 9 and the bit lines 11 can be formed of fine linear patterns and only one word line 9 is needed in each memory cell of the MRAM device employing such TMR units 4. It is therefore possible to achieve significant miniaturization and a far higher level of integration of the MRAM device.

While the MRAM device of the present embodiment is constructed with the fixed-spin element 3 of each cylinder-shaped TMR unit 4 disposed at an upper position, this construction may be modified such that the cylinder-shaped free-spin element 1 has an open bottom and is situated at an upper position with the fixed-spin element 3 located below.

Second Embodiment

Figure 2:
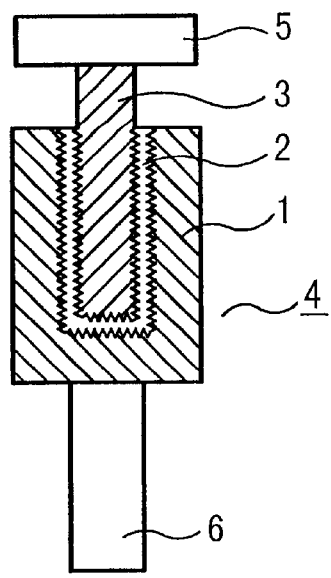
FIG. 2 is a cross-sectional diagram showing the construction of a TMR unit according to a second embodiment of the invention.

A TMR unit 4 according to a second embodiment of the invention is now described. FIG. 2 is a cross-sectional diagram showing the construction of the TMR unit 4 according to the second embodiment.

The TMR unit 4 of this embodiment has basically the same construction as the TMR unit 4 of the first embodiment shown in FIG. 1A but is characterized in that opposed surfaces of the free-spin element 1 and the fixed-spin element 3 are roughened as illustrated in FIG. 2. Protrusions and hollows on the surfaces of the free-spin element 1 and the fixed-spin element 3 increase the total area of their opposed surfaces. This serves to reduce the resistance of the TMR unit 4 per unit area and increase the amount of electric current flowed during the data read operation. This makes it possible to suppress the influence of electromagnetic interference in the data read operation and improve reliability of judgment on the amount of the electric current.

Third Embodiment

Figure 3:
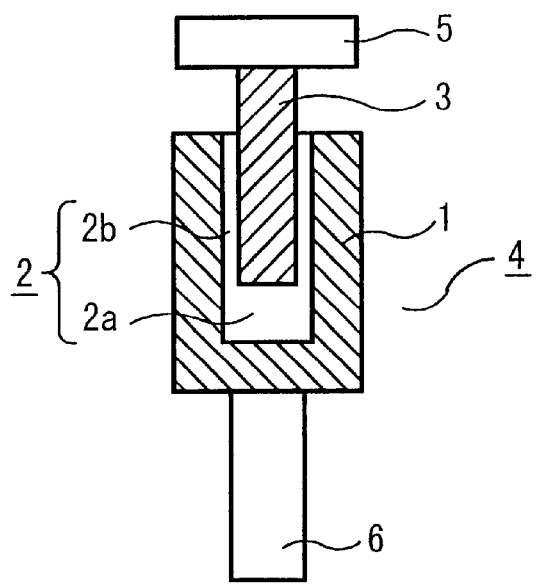
FIG. 3 is a cross-sectional diagram showing the construction of a TMR unit according to a third embodiment of the invention.

A TMR unit 4 according to a third embodiment of the invention is now described. FIG. 3 is a cross-sectional diagram showing the construction of the TMR unit 4 according to the third embodiment.

In this embodiment, a bottom portion 2a of an insulator layer 2 located in a cylinder-shaped free-spin element 1 is made thicker than a cylindrical wall portion 2b of the insulator layer 2 as illustrated in FIG. 2. This construction of the TMR unit 4 helps avoid such a problem that information on the direction of electron spin is not properly obtained in the data read operation due to a concentration of tunneling current at the bottom of the generally cylindrical TMR unit 4.

The construction of this embodiment is particularly suited when a cylindrical wall portion of the free-spin element 1 has a high resistance. Preventing concentration of the tunneling current at the bottom of the cylinder-shaped free-spin element 1, the thick bottom portion 2a of the insulator layer 2 serves to relatively increase electric current flowing through the cylindrical wall portion of the free-spin element 1. As a result, the spin direction in the free-spin element 1 can be detected with high reliability.

Fourth Embodiment

Figure 4:
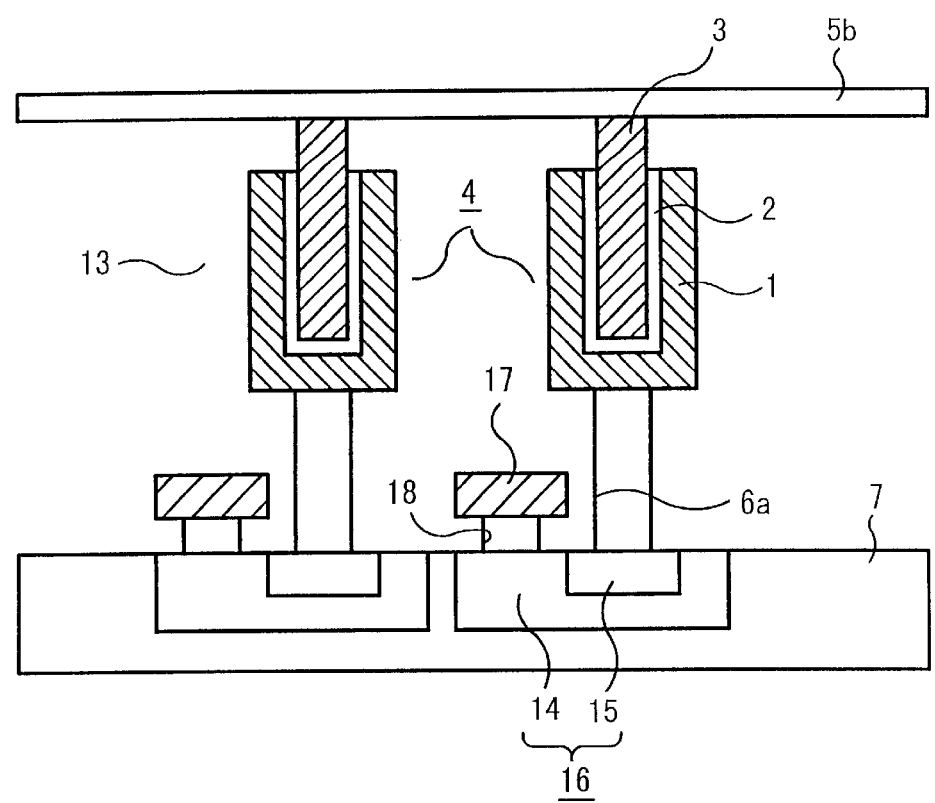
FIG. 4 is a cross-sectional diagram showing the construction of an MRAM device according to a fourth embodiment of the invention.

While access transistors 10 are formed in the MRAM device of the earlier-described first embodiment, there may be formed junctions in the substrate 7. FIG. 4 is a cross-sectional diagram showing the construction of an MRAM device according to a fourth embodiment of the invention. Referring to FIG. 4, $p^+$ diffusion layers 15 are formed in an n-well 14 which serves as a well region formed in a p-type substrate 7, and a contact hole 6a connects each $p^+$ diffusion layer 15 to its corresponding free-spin element 1. Designated by the numeral 5b is a linear pattern forming bit lines above TMR units 4, the bit lines 5b serving as a common electrode to which individual fixed-spin layers 3 are connected, and designated by the numeral 17 is an electrode layer connected to the corresponding n-well 14 via a contact hole 18. A pn junction formed by the $p^+$ diffusion layer 15 and the n-well 14 serves as a diode 16.

In this construction, each n-well 14 extends in a direction intersecting the bit lines 5b, the $p^+$ diffusion layer 15 is formed for each TMR unit 4, and the electrode layer 17 is connected to its corresponding $p^+$ diffusion layer 15 at one end of a memory array.

Operation of this MRAM device is now explained in the following. When reading data from a particular memory cell, a small voltage is applied between the bit line 5b and the $p^+$ diffusion layer 15 that intersect each other at the memory cell and the resistance is measured from the amount of electric current flowing through the TMR unit 4, the electric current falling within such a low range that no data is rewritten in the TMR unit 4.

When flowing an electric current from the bit line 5b to the substrate 7 for writing data in the TMR unit 4, a voltage is applied in a manner similar to the aforementioned data read operation except that the electric current is made larger than that flowed in the data read operation. When flowing an electric current in the opposite direction, the voltage applied between the n-well 14 and the $p^+$ diffusion layer 15 is made higher than their breakdown voltage to cause avalanche breakdown.

The MRAM device of this embodiment does not require any access transistors 10. This makes it possible to reduce the area occupied by each memory cell, thereby decreasing the amount of total area needed on the substrate 7.

Figure 5:
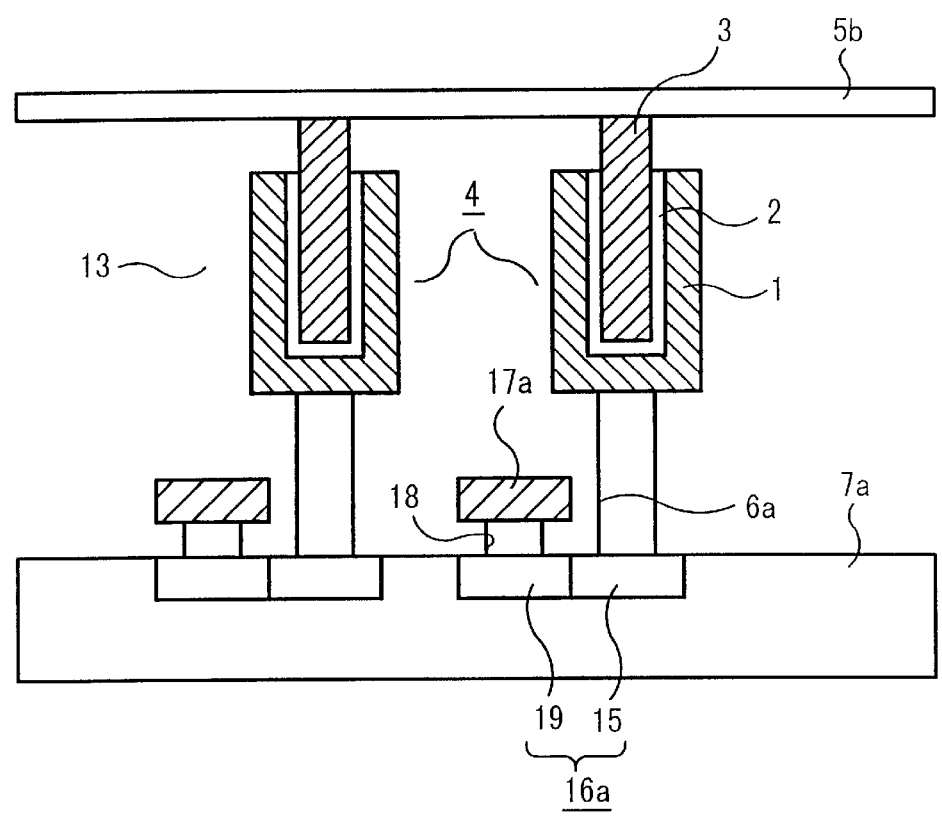
FIG. 5 is a cross-sectional diagram showing the construction of an MRAM device according to a variation of the fourth embodiment.

If a semiconductor-on-insulator (SOI) substrate 7a formed by depositing a thin layer of silicon on an insulator layer is substituted for the substrate 7 of FIG. 4, it is possible to form a diode 16a by arranging a p-type diffusion layer 15 and an n-type diffusion layer 19 side by side as shown in FIG. 5. In this variation of the fourth embodiment, the diffusion layers 15 and 19 are formed for each TMR unit 4 and each electrode layer 17a is formed to extend in a direction intersecting bit lines 5b and connected to the n-type diffusion layer 19 via a contact hole 18. The MRAM device thus constructed using the SOI substrate 7a is easy to manufacture and makes it possible to achieve further miniaturization and a yet higher level of integration. Furthermore, impurity densities in the p-type diffusion layer 15 and the n-type diffusion layer 19 can be individually controlled such that the avalanche breakdown would easily occur and that the amount of electric current needed for writing data in the TMR unit 4 can be easily reduced.

Figure 6:
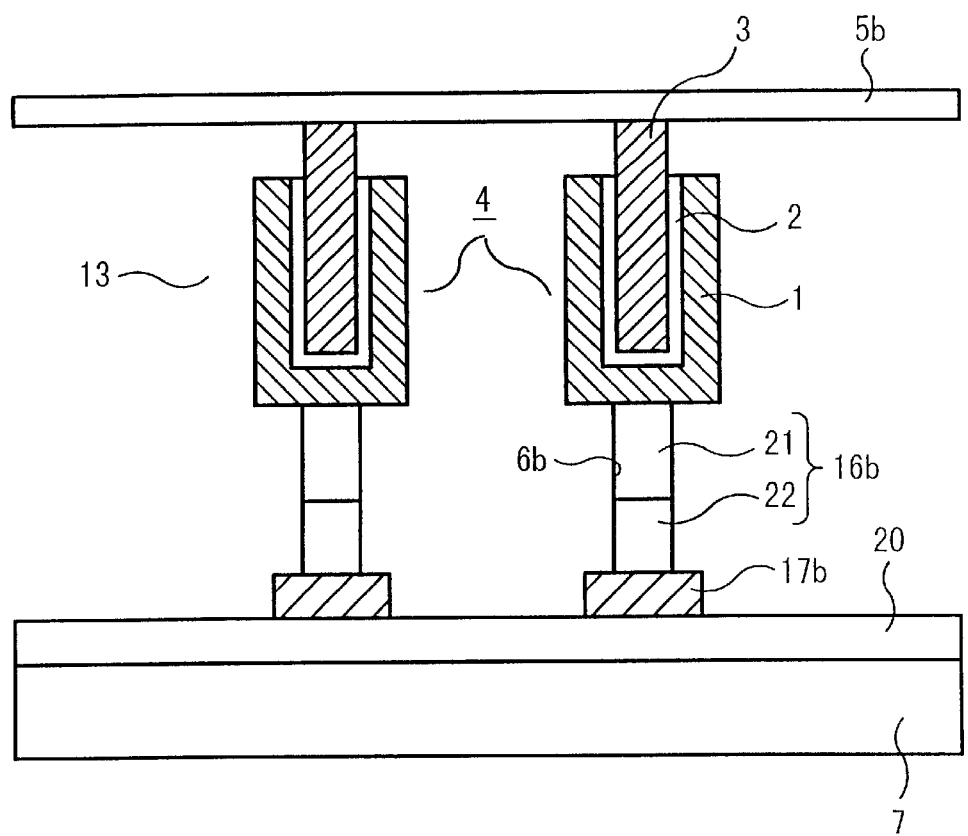
FIG. 6 is a cross-sectional diagram showing the construction of an MRAM device according to another variation of the fourth embodiment.

The MRAM device of FIG. 4 may be modified as shown in FIG. 6. In this variation of the fourth embodiment, a conductor layer 17b is formed on an insulator layer 20 on a substrate 7 such that each line of the conductor layer 17b intersects bit lines 5b, a free-spin element 1 of each TMR unit 4 is connected to the conductor layer 17b via a contact hole 6b, and a pn junction serving as a diode 16b is formed in the contact hole 6b by filling it with n-type doped silicon 22 and p-type doped silicon 21 on top of the n-type doped silicon 22.

Figure 7:
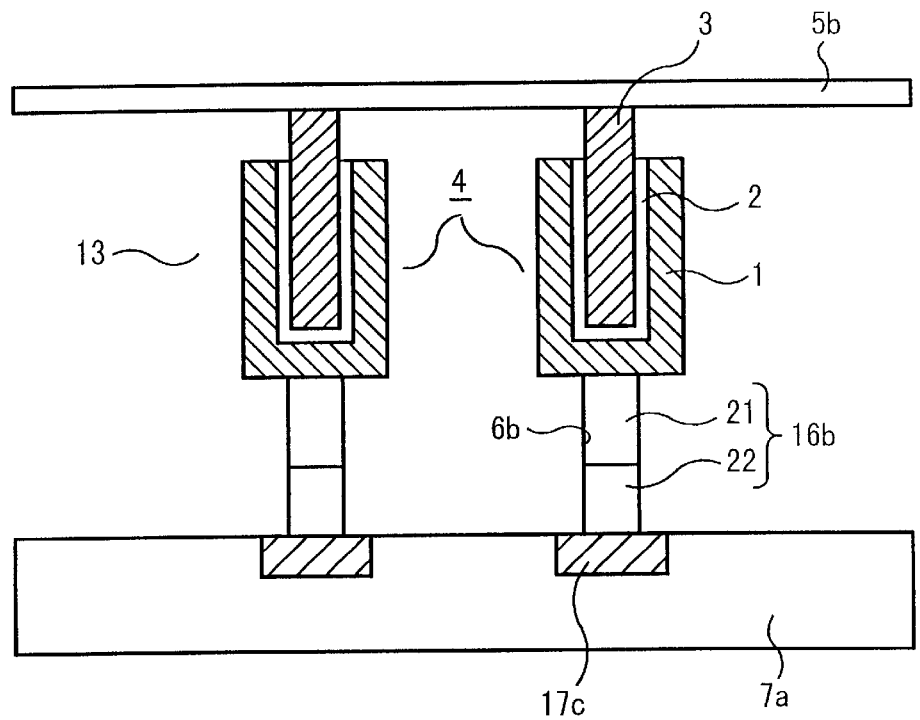
FIG. 7 is a cross-sectional diagram showing the construction of an MRAM device according to still another variation of the fourth embodiment.

The MRAM device of FIG. 6, in which the diode 16b is formed in each contact hole 6b, may be further modified as shown in FIG. 7. In this variation, an SOI substrate 7a is used instead of the ordinary semiconductor substrate 7 and a diffusion layer constituting a conductor layer 17c is formed in the SOI substrate 7a as illustrated.

Fifth Embodiment

Figure 8:
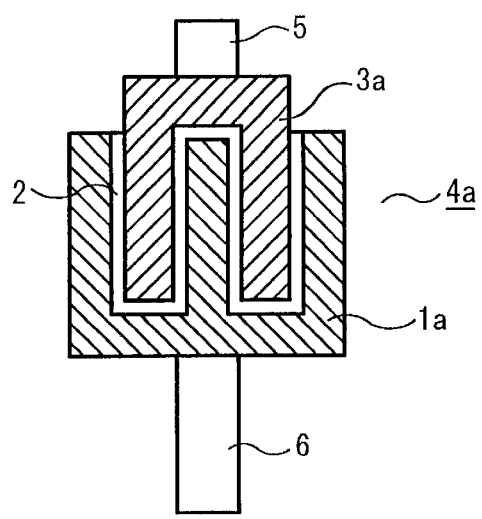
FIG. 8 is a cross-sectional diagram showing the construction of a TMR unit according to a fifth embodiment of the invention.

A TMR unit 4a according to a fifth embodiment of the invention is now described. FIG. 8 is a cross-sectional diagram showing the construction of the TMR unit 4a according to the fifth embodiment.

As can be seen from FIG. 8, the TMR unit 4a of this embodiment is characterized by its double-cylinder structure. Specifically, a free-spin element 1a has a central columnlike portion, an outer cylindrical portion surrounding the columnlike portion and a bottom portion joining together the columnlike portion and the cylindrical portion. A fixed-spin element 3a having a hollow cylindrical shape is located as if fitted in a cylindrical recess formed between the columnlike portion and the cylindrical portion of the free-spin element 1a with an insulator layer 2 located between the free-spin element 1a and the fixed-spin element 3a.

In the TMR unit 4a thus constructed, the direction of electron spins in the fixed-spin element 3a is fixed to one circumferential direction of the cylinder structure. Then, a tunneling current is flowed from the free-spin element 1a to the fixed-spin element 3a, or from the fixed-spin element 3a to the free-spin element 1a, to produce a rotating magnetic field, whereby the spin direction in the free-spin element 1a is set to one circumferential direction to write data in the TMR unit 4a. The data stored in the TMR unit 4a is read by determining the resistance as measured across the free-spin element 1a and the fixed-spin element 3a with an electric current flowed between them, the electric current falling within such a low range that no data is rewritten in the TMR unit 4a.

Since opposed surfaces of the free-spin element 1a and the fixed-spin element 3a have a larger total area in this embodiment, the resistance of the TMR unit 4a per unit area can be reduced and the amount of electric current flowed during the data read operation can be increased. This makes it possible to suppress the influence of electromagnetic interference in the data read operation and improve reliability of judgment on the amount of the electric current.

While the TMR unit 4a of this embodiment has the double-cylinder structure, a triple-cylinder structure may be employed in a modified form of the embodiment.

Sixth Embodiment

Figure 9A:
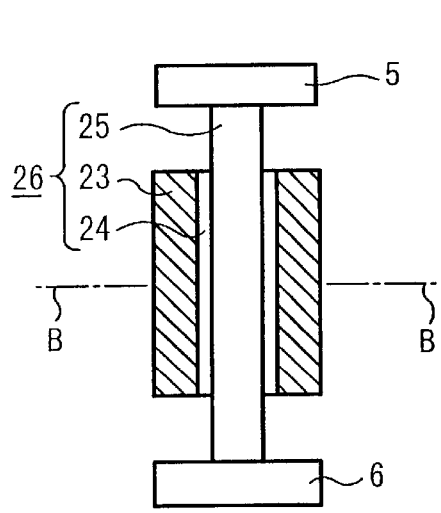
FIGS. 9A–9C are cross-sectional diagrams showing the constructions of a TMR unit and an MRAM device according to a sixth embodiment of the invention.
Figure 9B:
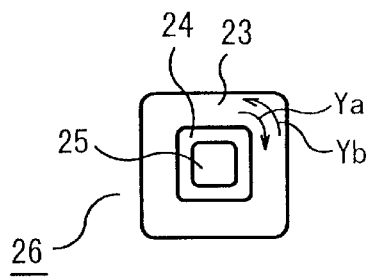
Figure 9C:
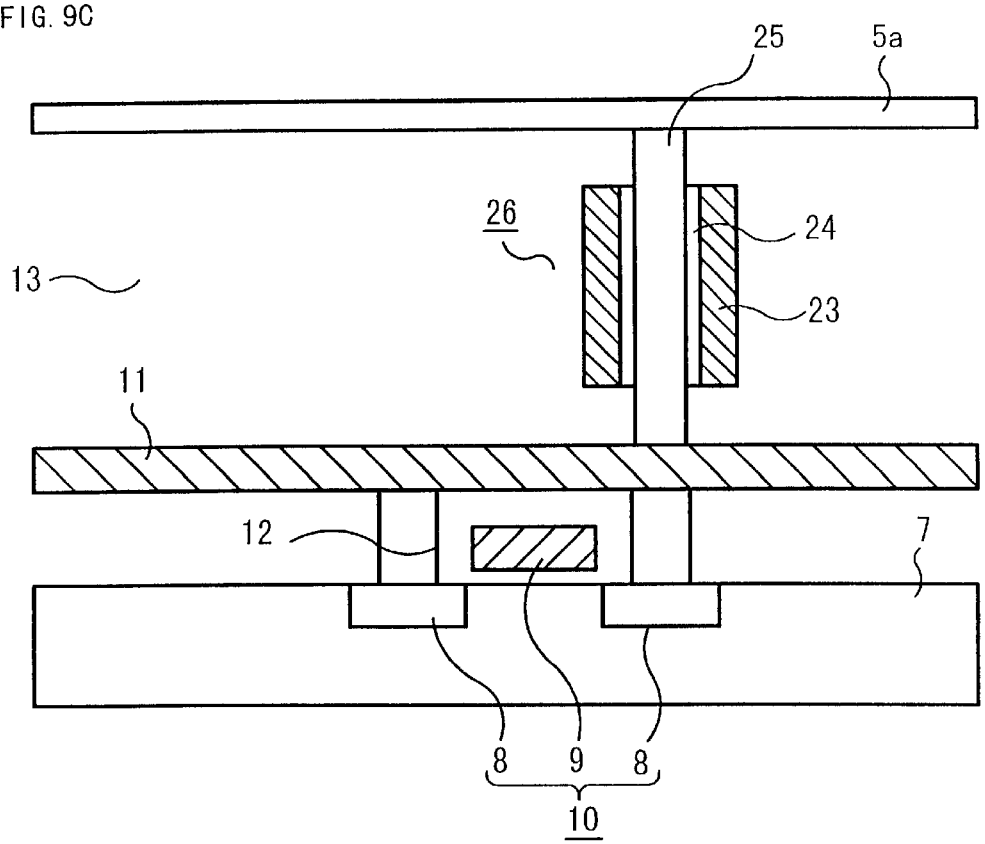
Figure 10:
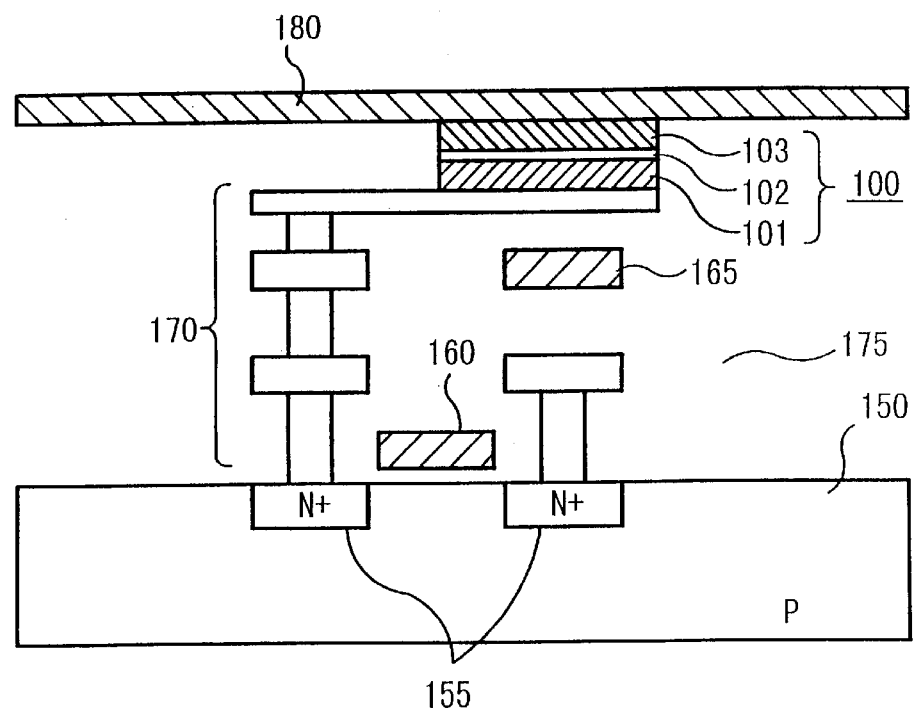
FIG. 10 is a cross-sectional diagram showing the construction of a conventional MRAM device.
Figure 11:
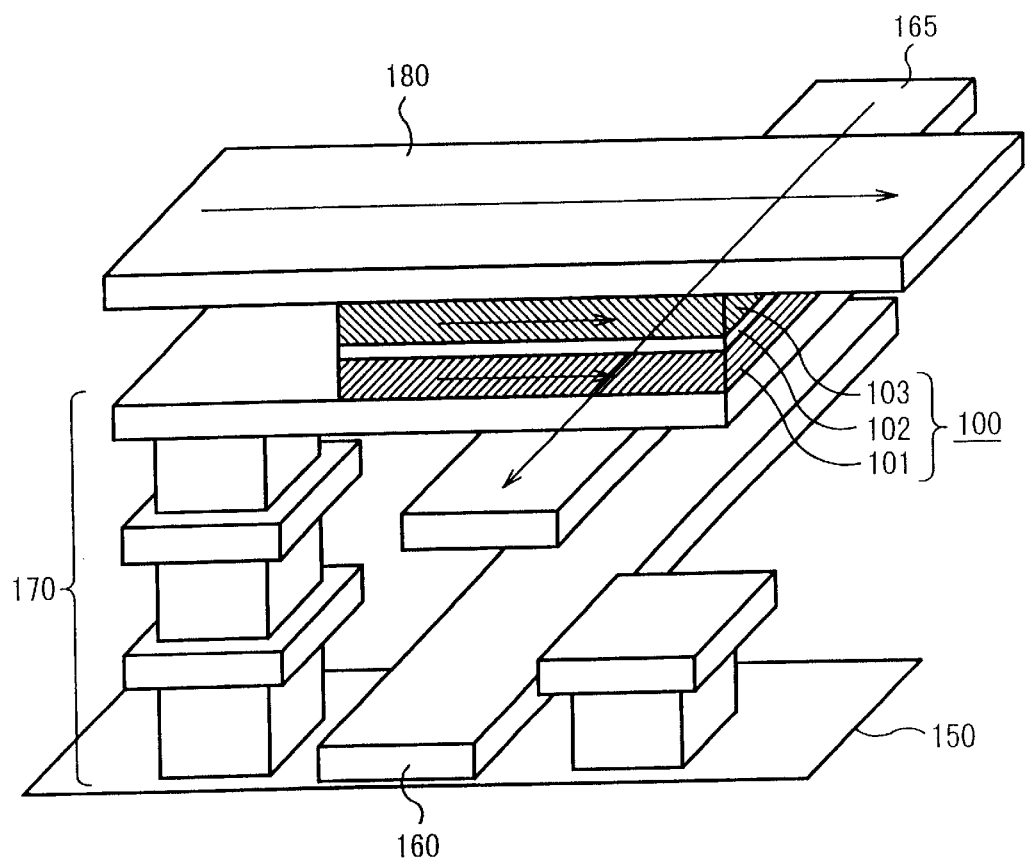
FIG. 11 is a diagram showing the operation of the conventional MRAM device.

A TMR unit 26 and an MRAM device according to a sixth embodiment of the invention are now described. FIGS. 9A–9C show the constructions of the TMR unit 26 and the MRAM device incorporating the TMR unit 26 according to the sixth embodiment of the invention, in which FIG. 9A is a cross-sectional diagram showing the construction of the TMR unit 26, FIG. 9B is a cross-sectional diagram taken along lines B—B of FIG. 9A, and FIG. 9C is a cross-sectional diagram showing the construction of the MRAM device. The cross-sectional shape of the TMR unit 26 shown in FIG. 9B need not necessarily be a square but may be a rectangle, circle or ellipse, for instance.

Referring to FIG. 9A, the TMR unit 26 includes a free-spin element (magnetic substance element) 23 formed into a cylindrical shape with its both ends opening, a columnlike conductor element 25 passing through the cylinder-shaped free-spin element 23, and an insulator layer 24 located between the free-spin element 23 and the columnlike conductor element 25. The spin direction in the free-spin element 23 is variable rather than fixed. Designated by the numerals 5 and 6 in FIG. 9A are electrode sections connected to the conductor element 25 and the free-spin element 23, respectively.

When writing data in the TMR unit 26 thus constructed, an electric current is flowed through the columnlike conductor element 25 to produce a rotating magnetic field around the conductor element 25. As a result, the spin direction in the free-spin element 23 is set to one circumferential direction (arrow Ya or arrow Yb) of its cylindrical shape as shown in FIG. 9B, whereby the data is written in the TMR unit 26. This circumferential rotating direction is determined by the direction of the electric current flowed through the conductor element 25.

On the other hand, the data stored in the TMR unit 26 is read by flowing an electric current through the conductor element 25 in a similar fashion to the data write operation and determining the resistance. When the electric current is flowed in a direction that reverses the spin direction in the free-spin element 23, the act of reading the data results in a destruction of the data. Since this destructive readout operation consumes energy, the resistance increases due to an increase in the line resistance of the magnetic substance of the free-spin element 23. This property is used in detecting the spin direction in the free-spin element 23, which represents information written in the TMR unit 26. When the information is read by flowing the electric current in a direction that reverses the spin direction in the free-spin element 23, the data is written back immediately after readout because the spin direction is modified by the readout operation.

The construction of the MRAM device is now described below using an example provided with access transistors 10 as is the case with the earlier-mentioned first embodiment. As shown in FIG. 9C, each memory cell on a p-type substrate 7 includes one each access transistor 10 and TMR unit 26. Each word line 9 and bit line 11 are made of fine linear patterns corresponding to cell size. The conductor element 25 of the TMR unit 26 is vertically arranged with a lower end of the conductor element 25 connected to one of source/drain regions 8. The other of the source/drain regions 8 is connected to the bit line 11 via a contact hole 12. Designated by the numeral 5a in FIG. 9C is a flat platelike common electrode to which an upper end of the conductor element 25 is connected. The common electrode 5a is disposed above individual TMR units 4 as if covering the entire chip (MRAM device), or a plurality of blocks of cell arrays. Designated by the numeral 13 is an interlayer insulator.

Operation of the MRAM device of this embodiment is now explained in the following. The common electrode 5a is normally set to a potential equal to half a source voltage and the bit line 11 is set to the ground potential or to a potential equal to the source voltage. When the access transistor 10 is turned on by applying a voltage to the word line 9, there is formed a path for electric current to pass from the common electrode 5a through the conductor element 25, the access transistor 10 and the bit line 11 in this order, wherein the direction of the electric current is determined by the potential of the bit line 11. The direction of the electric current flowing through the conductor element 25 is monitored and the spin direction is detected from the amount of the electric current. When a relatively large electric current flows, the spin direction in the free-spin element 23 is not altered by the readout operation. If the electric current would not easily flow immediately after application of the voltage to the word line 9, energy is consumed for reversely aligning the spin direction in the free-spin element 23 and, in this case, the spin direction detected is that before application of the voltage to the word line 9. Since the spin direction is modified in this case, the potential of the bit line 11 is reversed so that an electric current flows through the conductor element 25 in the opposite direction thereby writing back the original.

Since the spin direction in the free-spin element 23 is set to one circumferential direction of its cylindrical shape by producing a rotating magnetic field around the conductor element 25 in this embodiment, it is easy to align the spin direction due to efficient use of the rotating magnetic field produced. Consequently, the electric current required for writing data is reduced and the data write operation can be performed with a small amount of writing current.

Furthermore, since the TMR unit 26 is arranged in a vertical position, it is possible to reduce the area it occupies and its structure is suited for achieving miniaturization and a higher level of integration. Moreover, the area occupied by each TMR unit 26 is small, the word lines 9 and the bit lines 11 can be formed of fine linear patterns and only one word line 9 is needed in each memory cell in the MRAM device employing such TMR units 26. It is therefore possible to achieve remarkable miniaturization of the MRAM device and a far higher level of integration.

Furthermore, since the TMR unit 26 is constructed such that the columnlike conductor element 25 passes through the cylinder-shaped free-spin element 23 with the insulator layer 24 located between the free-spin element 23 and the conductor element 25, the construction of the TMR unit 26 is made much simpler and the memory cell structure of the MRAM device can be simplified.

While the present embodiment of the invention has thus far been described with reference to the MRAM device having the access transistors 10, the MRAM device may be provided with diodes formed of pn junctions as is the case with the fourth embodiment. This modification of the embodiment would help achieve further miniaturization and an even higher level of integration.

What is claimed is:

1. A tunneling magnetoresistive storage unit comprising:
   a hollow cylinder-shaped first magnetic substance element whose magnetization direction is variable, the first magnetic substance element having one open end;
   a columnlike second magnetic substance element whose magnetization direction is fixed to one circumferential direction, the second magnetic substance element being formed inside the cylinder-shaped first magnetic substance element; and
   an insulator layer located between the first and second magnetic substance elements;
   wherein a tunneling current is flowed between the first and second magnetic substance elements to produce a rotating magnetic field for setting the magnetization direction of the first magnetic substance element to one of its circumferential directions, and wherein magnetoresistance due to a change in the magnetization direction of the first magnetic substance element with respect to the magnetization direction of the second magnetic substance element is used to represent binary data.

2. A tunneling magnetoresistive storage unit comprising:
   a first magnetic substance element whose magnetization direction is variable, the first magnetic substance element being formed into a one-piece structure including a columnlike portion and a cylindrical portion which surrounds the columnlike portion and has one open end;
   a hollow cylinder-shaped second magnetic substance element whose magnetization direction is fixed to one circumferential direction, the second magnetic substance element having one open end and being located between the columnlike portion and the cylindrical portion of the first magnetic substance element; and
   an insulator layer located between the first and second magnetic substance elements;
   wherein a tunneling current is flowed between the first and second magnetic substance elements to produce a rotating magnetic field for setting the magnetization direction of the first magnetic substance element to one of its circumferential directions, and wherein magnetoresistance due to a change in the magnetization direction of the first magnetic substance element with respect to the magnetization direction of the second magnetic substance element is used to represent binary data.

3. The tunneling magnetoresistive storage unit according to claim 1, wherein opposed surfaces of the first and second magnetic substance elements are roughened to increase the total area of their opposed surfaces.

4. The tunneling magnetoresistive storage unit according to claim 1, wherein a bottom portion of the insulator layer located at the bottom of the cylinder-shaped first magnetic substance element is made thicker than a cylindrical wall portion of the insulator layer.

5. A tunneling magnetoresistive storage unit comprising:
   a hollow cylinder-shaped magnetic substance element whose magnetization direction is variable, the magnetic substance element opening at both ends;
   a columnlike conductor element passing through the cylinder-shaped magnetic substance element; and
   an insulator layer located between the magnetic substance element and the conductor element;
   wherein an electric current is flowed through the conductor element to produce a rotating magnetic field for setting the magnetization direction of the magnetic substance element to one of its circumferential directions, and the magnetization direction of the magnetic substance element is detected from the amount of electric current which flows through the conductor element.

* * * * *